US008428536B2

(12) United States Patent
Khoini-Poorfard et al.

(10) Patent No.: US 8,428,536 B2
(45) Date of Patent: Apr. 23, 2013

(54) LOW-COST RECEIVER USING AUTOMATIC GAIN CONTROL

(75) Inventors: Ramin Khoini-Poorfard, Austin, TX (US); Alessandro Piovaccari, Austn, TX (US); David S. Trager, San Marcos, TX (US)

(73) Assignee: Silicon Laboratories Inc., Austin, TX (US)

( * ) Notice: Subject to any disclaimer, the term of this patent is extended or adjusted under 35 U.S.C. 154(b) by 844 days.

(21) Appl. No.: 12/323,040

(22) Filed: Nov. 25, 2008

(65) Prior Publication Data

US 2010/0130153 A1     May 27, 2010

(51) Int. Cl.
*H04B 1/06*     (2006.01)
*H04B 7/00*     (2006.01)
*H04L 27/08*     (2006.01)

(52) U.S. Cl.
USPC ............ 455/234.2; 455/241.1; 455/251.1; 455/253.2; 375/345

(58) Field of Classification Search ............. 455/234.2, 455/239.1–242.2, 251.1, 253.2; 375/345
See application file for complete search history.

(56) References Cited

U.S. PATENT DOCUMENTS

| 4,998,106 | A | * | 3/1991 | Koga et al. ............... 341/139 |
| 5,808,575 | A | * | 9/1998 | Himeno et al. ............ 341/139 |
| 6,088,583 | A | * | 7/2000 | Shimizu et al. ........... 455/235.1 |
| 6,134,430 | A | | 10/2000 | Younis et al. |
| 6,239,655 | B1 | | 5/2001 | Orozov et al. |
| 6,931,124 | B1 | | 8/2005 | Rubacha et al. |
| 7,212,798 | B1 | | 5/2007 | Adams et al. |
| 2006/0222115 | A1 | | 10/2006 | Dornbusch et al. |

FOREIGN PATENT DOCUMENTS

| EP | 1349268 | 1/2003 |
| FR | 2884987 | 4/2005 |
| WO | 8707795 | 12/1987 |

* cited by examiner

*Primary Examiner* — Lincoln Donovan
*Assistant Examiner* — Colleen O Toole
(74) *Attorney, Agent, or Firm* — Polansky & Associates, P.L.L.C.; Paul J. Polansky

(57) ABSTRACT

A receiver (100) includes a first element (110) with a signal input, a control input, a signal output, and gain steps of a first magnitude, a signal processing circuit (120-168) with a signal input coupled to the first element, and a signal output, a second element (180) that has a signal input coupled to signal processing circuit, a control input, a signal output, and gain steps of a second magnitude smaller than the first magnitude, and a controller (180) that has a control output coupled to the first element (110), a control output coupled to the second element (180), and that adjusts receiver (100) gain by changing the first element (110) gain by a first magnitude, changing the second element (180) gain by substantially an inverse first magnitude, and subsequently changing the gain of the second element (180) by steps of the second magnitude to achieve a desired gain.

20 Claims, 3 Drawing Sheets

LOW-COST RECEIVER USING AUTOMATIC GAIN CONTROL

FIELD OF THE DISCLOSURE

The present disclosure relates generally to a radio frequency (RF) receiver and, more particularly relates to an RF receiver using automatic gain control.

BACKGROUND

Radio frequency (RF) receivers are used in a wide variety of applications such as television receivers, cellular telephones, pagers, global positioning system (GPS) receivers, cable modems, cordless phones, satellite radio receivers, and the like. As used herein, a "radio frequency" signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. One common type of RF receiver is the so-called superheterodyne receiver. A superheterodyne receiver mixes the desired data-carrying signal with the output of tunable oscillator to produce an output at a fixed intermediate frequency (IF). The fixed IF signal can then be conveniently filtered and converted down to baseband for further processing. Thus a superheterodyne receiver requires two mixing steps.

For example, a television receiver may translate one channel in the band of 48 MHz to 870 MHz to an IF of 44 MHz. And within the United States, FM radios will typically translate FM audio signals, which are broadcast in 200 KHz channels in the frequency band from 88.1 MHz to 107.9 MHz, to an IF of 10.7 MHz. Because of the wide frequency range required of television receivers, it has been difficult to design high quality television receivers at low cost.

High quality television receivers have traditionally included automatic gain control (AGC) circuits that adjust the gain or attenuation of various elements in the receiver, in order to regulate the power levels in the receiver circuitry. For example, a television signal with low input power can be amplified to increase the signal strength for further processing. In another example, a filtered signal may be too powerful for a following component, and so the filtered signal can be attenuated to decrease the power level. Without such AGC circuits, the displayed image of a television signal will get dimmer as the power level drops, and brighter as power level rises.

In receivers with AGC circuits, however, sudden changes in the input power level can also cause undesirable operation, causing the displayed image to appear to flicker, and the sound track to include unpleasant pops in volume. Such changes in input signal power level are common as, for example, when a moving receiver passes into a tunnel or behind a building, or an obstruction, such as an airplane, passes between the transmitter and the receiver.

To efficiently implement AGC in highly integrated receivers, the gain or attenuation of the various elements can be controlled discretely in small gain steps. To achieve the small gain steps, gain or attenuation elements can be implemented by a large number of small gain or attenuation elements that are switched on or off in order to achieve the desired gain. Such small gain or attenuation elements are easily created in an integrated circuit process technology, such as a complimentary metal-oxide-silicon (CMOS) process. However, the large number of gain or attenuation elements leads to larger die sizes, and consequently to higher costs to produce.

What is needed, then, are new receiver architectures for applications such as television receivers that retain the high quality picture and sound properties of AGC circuits with small gain or attenuation steps, and the ease of manufacturing of integrated process technologies, but with smaller die sizes and at lower costs.

SUMMARY

In a particular embodiment, a receiver includes a first programmable gain element, a signal processing circuit, a second programmable gain element, and a controller. The first programmable gain element has an input for receiving a radio frequency (RF) input signal, an output, and a control input, and has gain steps of a first magnitude. The signal processing circuit has an input coupled to the output of the first programmable gain element and an output. The second programmable gain element has an input coupled to the output of the signal processing circuit, an output, and a control input, and has gain steps of a second magnitude that is smaller than the first magnitude. The controller has a first output coupled to the control input of the first programmable gain element, and a second output coupled to the control input of the second programmable gain element, and adjusts a gain of the receiver by a first desired gain by changing a gain of the first programmable gain element by a first amount and also changing a gain of the second programmable gain element by substantially a corresponding inverse first amount, and subsequently changing the gain of the second programmable gain element incrementally by steps of the second magnitude to achieve the first desired gain.

In another embodiment, a receiver includes a first programmable gain element, a signal processing circuit, a second programmable gain element, and a controller. The first programmable gain element adjusts a gain of a radio frequency (RF) input signal to provide an adjusted RF input signal with gain steps of a first magnitude. The signal processing circuit processes the adjusted RF input signal to provide a processed signal. The second programmable gain element adjusts a gain of the processed signal to provide an output signal with gain steps of a second magnitude that is smaller than the first magnitude. The controller adjusts a gain of the receiver by a desired gain by changing a gain of the first programmable gain element by a first amount and also changing a gain of the second programmable gain element by substantially a corresponding inverse first amount, and subsequently changing the gain of the second programmable gain element incrementally by steps of the second magnitude to achieve the desired gain.

In yet another embodiment, a method includes adjusting a gain of a radio frequency (RF) input signal by a first amount to provide an adjusted RF input signal using a gain step of a first magnitude, processing the adjusted RF input signal to provide a processed signal, adjusting a gain of the processed signal by substantially an inverse first amount to provide an output signal, and subsequently changing a gain of the output signal incrementally using a plurality of gain steps of a second magnitude to achieve a desired gain, where the second magnitude is smaller than the first magnitude.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

In general, a receiver as described herein is highly integrated, including a low noise amplifier (LNA), a tracking bandpass filter, a preconditioning circuit, a mixing circuit, an intermediate frequency (IF) section, a digital demodulator section, a microcontroller unit, and power detectors on a main integrated circuit die, and high quality inductors used in the tracking bandpass filter on an integrated passive device (IPD) die. The receiver combines the IPD die and the main integrated circuit die into a multi-chip module (MCM). As such, the receiver appears to be a single integrated circuit to the end user. The high level of integration in the main integrated circuit die is achieved by permitting relatively large gain steps for the LNA, the preconditioning circuit, and the IF section, and compensating for the large gain steps in the digital demodulator section. In this way, the complexity, cost and space on the main die for the LNA, the preconditioning circuit, and the IF section is reduced, while a high quality television output signal is maintained.

Figure 1:
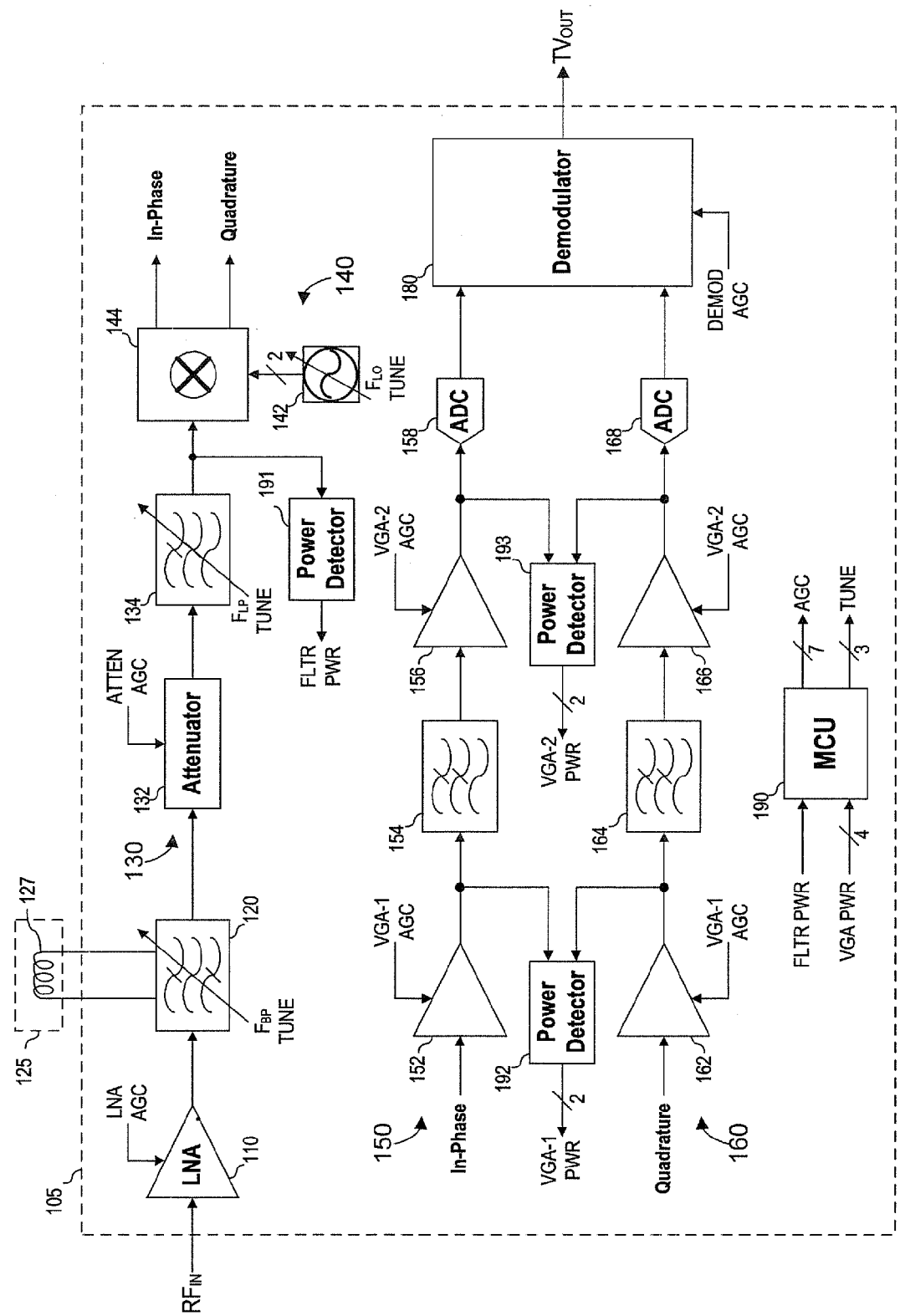
FIG. 1 illustrates in partial block diagram and partial schematic form a television receiver according to an embodiment of the present invention.

FIG. 1 illustrates in partial block diagram and partial schematic form a television receiver 100 according to an embodiment of the present invention. Receiver 100 includes a main integrated circuit die 105, and an IPD die 125. IPD die 125 includes a set of inductors in which a representative inductor 127 is illustrated. Main integrated circuit die 105 includes generally a low noise amplifier (LNA) 110, a tracking bandpass filter 120, a preconditioning circuit 130, a mixing circuit 140, a first intermediate frequency (IF) processing circuit 150, a second IF processing circuit 160, a demodulator 180, a microcontroller unit (MCU) 190, and three power detectors 191, 192, and 193. LNA 110 has a first input for receiving an RF input signal labeled "$RF_{IN}$", a second input for receiving an LNA automatic gain control signal labeled "LNA AGC", and an output. Tracking bandpass filter 120 has a first input connected to the output of LNA 110, a second input for receiving a center frequency tuning signal labeled "$F_{BP}$ TUNE", two terminals connected to inductor 127, and an output.

Preconditioning circuit 130 includes an attenuator 132 and a filter 134. Attenuator 132 has a first input connected to the output of tracking bandpass filter 120, a second input for receiving an attenuator automatic gain control signal labeled "ATTEN AGC", and an output. Filter 134 has a first input connected to the output of attenuator 132, a second input for receiving a cutoff frequency tuning signal labeled "$F_{LP}$ TUNE", and an output.

Mixing circuit 140 includes a local oscillator 142 and a mixer 144. Local oscillator 142 has an input for receiving a local oscillator tuning signal labeled "$F_{LO}$ TUNE", and an output for providing two mixing signals, including an in-phase mixing signal and a quadrature mixing signal. Mixer 144 has a first input connected to the output of filter 134, a second input connected to the output of local oscillator 142, a first output for providing an in-phase IF signal, and a second output for providing a quadrature IF signal.

IF circuit 150 includes a variable gain amplifier (VGA) 152, a lowpass filter 154, a VGA 156, and an analog-to-digital converter (ADC) 158. VGA 152 has a first input connected to the first output of mixer 144, a second input for receiving a VGA automatic gain control signal labeled "VGA-1 AGC", and an output. Lowpass filter 154 has an input connected to the output of VGA 152, and an output. VGA 156 has a first input connected to the output of lowpass filter 154, a second input for receiving a VGA automatic gain control signal labeled "VGA-2 AGC", and an output. ADC 158 has an input connected to the output of VGA 156, and an output.

IF circuit 160 includes a VGA 162, a lowpass filter 164, a VGA 166, and an ADC 168. VGA 162 has a first input connected to the second output of mixer 144, a second input for receiving signal VGA-1 AGC, and an output. Lowpass filter 164 has an input connected to the output of VGA 162, and an output. VGA 166 has a first input connected to the output of lowpass filter 164, a second input for receiving a signal VGA-2 AGC, and an output. ADC 168 has an input connected to the output of VGA 166, and an output. In another embodiment, additional gain or attenuation elements are present in IF circuits 150 and 160. Such additional elements may also include gain control signals.

Demodulator 180 has a first and a second input connected to the outputs of ADCs 158 and 168, respectively, a third input for receiving a gain control signal labeled "DEMOD AGC", and an output for providing a demodulated output signal labeled "$TV_{OUT}$". MCU 190 has a first input, a second input, a first output providing the frequency tuning signals $F_{BP}$ TUNE, $F_{LP}$ TUNE, and $F_{LO}$ TUNE, and a second output for providing the AGC signals LNA AGC, ATTEN AGC, VGA-1 AGC (×2), VGA-2 AGC (×2), and DEMOD AGC.

Power detector 191 has an input connected to the output of filter 134, and an output connected to the first input of MCU 190 for providing a power level signal for tracking bandpass filter 120, labeled "FLTR PWR". Power detector 192 has first and second inputs connected to the outputs of VGA 152 and VGA 162, respectively, and an output connected to the second input of MCU 190 for providing two signals, including a power level signal for VGA 152 and a power level signal for VGA 162, and labeled collectively as "VGA-1 PWR". Power detector 193 has first and second inputs connected to the outputs of VGA 156 and VGA 166, respectively, and an output connected to the second input of MCU 190 for providing two signals, including a power level signal for VGA 156 and a power level signal for VGA 566, and labeled collectively as "VGA-2 PWR". MCU 190 controls receiver 100 by providing control signals LNA AGC, $F_{BP}$ TUNE, ATTEN AGC, $F_{LP}$ TUNE, $F_{LO}$ TUNE, VGA ADC, VGA-2 AGC, and DEMOD AGC as discrete outputs, as shown in FIG. 1, or by communicating the control signals over a serial interface from which they are received and driven.

In operation, receiver 100 functions as a television receiver adapted to receive and demodulate television channels. Signal $RF_{IN}$ is a broadband signal that includes energy from several television signals modulated onto carrier waves at different frequencies. The different carrier waves constitute the television channels from which television content can be received. Signal $RF_{IN}$ can be received from an antenna, from a cable television connection or from another broadband signal source. MCU 190 is adapted to control the various elements in receiver 100 according to the channel selected by the user. Receiver 100 uses a dual-filter architecture for the pre-mixing tuner. Signal $RF_{IN}$ is received and amplified as necessary in LNA 110 under the control of MCU 190 via signal LNA AGC.

Tracking bandpass filter 120 is a second-order LC filter that assists in providing image rejection by filtering neighboring channels, a significant part of whose energy could be reflected back into the passband. Tracking bandpass filter 120 is implemented with inductor 127 and an array of switched capacitors, the selection of which functions to tune the center frequency of the passband of tracking bandpass filter 120 under the control of MCU 190 via signal $F_{BP}$ TUNE. Attenuator 132 provides attenuation of the partially filtered $RF_{IN}$ signal from tracking bandpass filter 120 under the control of MCU 190 via signal ATTEN AGC. Filter 134 provides additional attenuation of the third harmonic of the mixing signal under the control of MCU 190 via signal $F_{LP}$ TUNE to prevent unwanted energy from a neighboring channel from being mixed into the passband. This frequency is important because local oscillator 142 uses a digital mixing signal that is a square wave, which has significant energy at its third harmonic.

Mixer 144 is a quadrature mixer that mixes the filtered and attenuated $RF_{IN}$ signal with the signal from local oscillator 142 to produce sum and difference output frequencies:

$$f_1 = f_{CW} + f_{LO} \quad [1]$$

and $$f_2 = f_{CW} - f_{LO} \quad [2]$$

where $f_{CW}$ is the frequency of the desired carrier wave of the desired channel, and $f_{LO}$ is the local oscillator frequency. Where the desired IF is $f_1$, receiver 100 is said to be a high-IF receiver, and where the desired IF is $f_2$, receiver 100 is said to be a low-IF receiver. In receiver 100, the desired IF is selectable in the range of 3 to 5 megahertz (MHz), and thus receiver 100 implements a low-IF architecture. Additionally, the desired IF is selectable to 0 MHz, allowing receiver 100 to also operate as a direct down conversion receiver. To tune a selected channel to the desired IF, local oscillator 142 is set to a frequency that, when mixed with the selected channel, translates the selected channel to a low IF frequency of 0 MHz or 3-5 MHz, under the control of MCU 190 via signal $F_{LO}$. Local oscillator 142 is configured to provide two outputs to mixer 144: an in-phase local oscillator output, and a quadrature local oscillator output. Mixer 144 provides an in-phase IF signal to IF circuit 150, and a quadrature IF signal to IF circuit 160, for further processing. In other embodiments, receiver 100 may use a high-IF architecture or it may use a direct down conversion architecture. After reading this disclosure, it will be appreciated that receiver 100 is configurable to be compatible with various television standards around the world.

Each of IF circuits 150 and 160 perform further signal conditioning on the in-phase and quadrature IF signals from mixer 144. For example, the in-phase IF signal is further conditioned in IF circuit 150, where the in-phase IF signal is amplified by VGA 152 under the control of MCU 190 via signal VGA-1 AGC. Lowpass filter 154 provides attenuation of the desired channel; for example, when operating at an IF of 4 MHz, lowpass filter 154 provides attenuation above a cutoff frequency of 7 MHz to filter unwanted energy above the channel bandwidth. VGA 156 receives the filtered in-phase IF signal and amplifies or attenuates it to a level that prevents signal clipping in ADC 158. VGA 156 operates under the control of MCU 190 via signal VGA-2 AGC. ADC 158 converts the filtered and level set in-phase IF signal to the digital domain. IF circuit 160 functions similarly to IF circuit 150, except that processing in IF circuit 160 is done on the quadrature IF signal from mixer 144.

Demodulator 180 receives the in-phase and quadrature digital domain IF signals from ADCs 158 and 168, respectively, and performs various digital signal processing functions, including digitally mixing the in-phase and quadrature digital domain IF signals to a baseband signal to provide signal $TV_{OUT}$, and adjusting the gain of the baseband signal to control the power level of signal $TV_{OUT}$ under the control of MCU 190 via signal DEMOD AGC.

Changes in the power level of signal $TV_{OUT}$ of greater than about 0.025 dB will result in visible changes in the brightness of a resulting image displayed on a monitor or television, resulting in an unpleasant flickering of the image. However, gain steps in LNA 110, attenuator 132, and VGAs 152, 156, 162, and 166 of greater than 0.025 dB permits simpler design and implementation for such elements, while maintaining adequate performance in terms of linearity, amplitude and phase matching, signal to noise ratio, etc. Such simplified design may also result in more compact, more efficient designs that are easier to integrate onto the main integrated circuit die 105. To this end, LNA 110 provides gain in the range of about −6 dB to 18 dB, which MCU 190 controls in steps of about 1.0 dB. Attenuator 132 provides attenuation in the range of about −13 dB to −3 dB, which MCU 190 controls in steps of about 1 dB. VGAs 152, 156, 162, and 166 provide gain in the range of about 0 dB to 15 dB, which MCU 190 controls in steps of about 0.5 dB.

To eliminate the flickering image, MCU 190 controls the gain of demodulator 180 in much finer steps of about 0.025 dB, and coordinates gain changes between the gain elements. In general, MCU 190 determines the sum of the gain steps for LNA 110, attenuator 132, and VGAs 152, 156, 162, and 166, applies the inverse gain to demodulator 180, and then raises or lowers the gain in demodulator 108 in 0.025 dB steps until the desired gain level is achieved. The gain control operation will be described further with respect to FIGS. 2 and 3 below.

Figure 2:
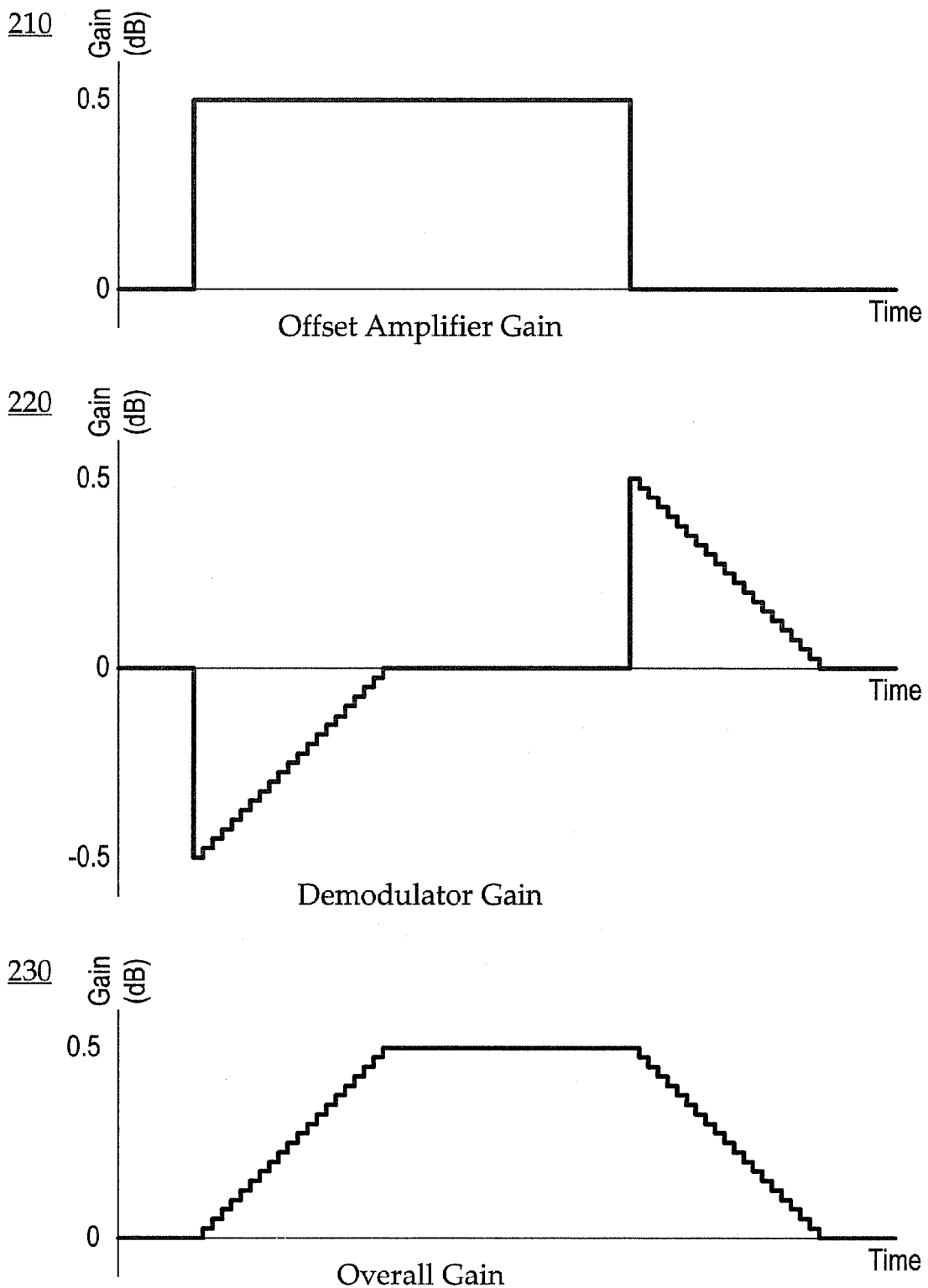
FIG. 2 illustrates graphs of gain levels in an embodiment of the television receiver of FIG. 1.

FIG. 2 illustrates graphs of gain levels in an embodiment of receiver 100, where the vertical axes represent gain in dB, and the horizontal axes represent time. Graph 210 illustrates the gain of VGA 156, where, for example, power detector 193 detects a drop and subsequent rise in the output power level of VGA 156. MCU 190 receives the corresponding signal VGA-2 PWR, and asserts the appropriate signal VGA-2 AGC to increase the gain of VGA 156 by one step of 0.5 dB, and subsequently to decrease the gain of VGA 156 by one step of 0.5 dB. Graph 220 illustrates the gain of demodulator 180 in response to the drop and subsequent rise in the output power level of VGA 156. Here, when MCU 190 increases the gain of VGA 156 by 0.5 dB, MCU 190 asserts a corresponding signal DEMOD AGC to decrease the gain of demodulator 180 by 0.5 dB, and to subsequently increase the gain of demodulator 180 by a total of 0.5 dB in 0.025 dB steps over a period of time.

Likewise, when MCU 190 decreases the gain of VGA 156 by 0.5 dB, MCU 190 asserts a corresponding signal DEMOD AGC to increase the gain of demodulator 180 by 0.5 dB, and to subsequently decrease the gain of demodulator 180 by a total of 0.5 dB in 0.025 dB steps over a period of time. Graph 230 illustrates the overall gain that results from the combined gain treatment in VGA 156 and demodulator 180. Note that, while the gain of VGA 156 increases or decreases in 0.5 dB steps, the overall gain only increases or decreases gradually by 0.025 dB steps. The result is that the output power level of VGA 156 is adjusted in a large discrete step in response to changing conditions, but the output power level of demodulator 180 changes slowly to eliminate flickering in the displayed image. Note that FIG. 2 shows the VGA 156 gain steps and the large demodulator 180 gain steps occurring at substantially the same time. in practice, MCU 190 can delay the assertion of DEMOD AGC with respect to the assertion of VGA-2 AGC to account for signal delay times between VGA 156 and demodulator 180.

Similarly, when LNA AGC, ATTEN AGC, VGA-1 AGC or VGA-2 AGC are asserted to increase the gain levels of LNA 110, attenuator 132, or VGAs 152, 162, or 166, MCU 190 changes signal DEMOD AGC to decrease the gain of demodulator 180 by a corresponding amount, and to subsequently increase the gain of demodulator 180 by the same amount in smaller steps of 0.025 dB over a period of time. Likewise, when LNA AGC, ATTEN AGC, VGA-1 AGC or VGA-2 AGC are asserted to decrease the gain levels of LNA 110, attenuator 132, or VGAs 152, 162, or 166, MCU 190 changes signal DEMOD AGC to increase the gain of demodulator 180 by a corresponding amount, and to subsequently decrease the gain of demodulator 180 by the same amount in smaller steps of 0.025 dB over a period of time. Again, MCU 190 can delay the assertion of DEMOD AGC with respect to the assertion of LNA AGC, ATTEN AGC, VGA-1 AGC or VGA-2 AGC to account for signal delay times between LNA 110, attenuator 132, VGAs 152, 162, and 166, and demodulator 180.

In another embodiment (not shown), MCU 190 functions to sum up the gain steps of LNA 110, attenuator 132, and VGAs 152, 156, 162, and 166, to assert signal DEMOD AGC to increase or decrease the gain of demodulator 180 by an inverse amount, and to subsequently decrease or increase the gain of demodulator 180 by the same amount in steps of 0.025 dB. In the embodiments where additional gain or attenuation elements are present in preconditioning circuit 130, or IF circuits 150 and 160, MCU 190 also accounts for the gain increases or decreases of the additional elements in determining the gain of demodulator 180

In another embodiment, to further reduce flickering further, the gain steps are timed to correspond with analog television signal vertical and horizontal blanking periods, or synchronization black outs. For digital television signals, which may not include vertical or horizontal blanking periods, MCU 190 can simulate a vertical or horizontal blanking period by controlling ADCs 158 and 168, such that the outputs of ADCs 158 and 168 are held constant until any gain step disturbances have faded out, and then the outputs of ADCs 158 and 168 are permitted to resume normal output. In another embodiment, MCU 190 can perform a linear interpolation of between the output level of ADCs 158 and 168 before the blanking period and the output level of ADCs 158 and 168 after the blanking period.

In receiver 100, one or more of LNA 110, attenuator 132, or VGAs 152, 156, 162, and 166 are implemented as multiple discrete gain elements that are switched on or off as gain demands change, and the automatic gain control signals LNA AGC, ATTEN AGC, VGA-1 AGC or VGA-2 AGC are implemented as digital signals, having logic "1" states, and logic "0" states. In this case, the gain steps of LNA 110, attenuator 132, or VGAs 152, 156, 162, and 166 occur abruptly, appearing to be substantially a step function, as shown in graph 210. However such step functions can produce noise in the desired signal, reduce the signal-to-noise ratio of the subject gain element, and permit unwanted sideband intrusion, or splatter, into the desired signal. Thus, in another embodiment of receiver 100, one or more of LNA 110, attenuator 132, and VGAs 152, 156, 162, and 166 include a resistor-capacitor network to smooth the transition of the automatic gain control signal. Note that a resistor-capacitor network will cause the transition between a logic "1" state and a logic "0" state, and vice versa, to occur more slowly, permitting the gain stages to switch on or off gradually. Such gradual switching of gain elements produces less noise, and improves the signal-to-noise ratio of the subject gain element.

Figure 3:
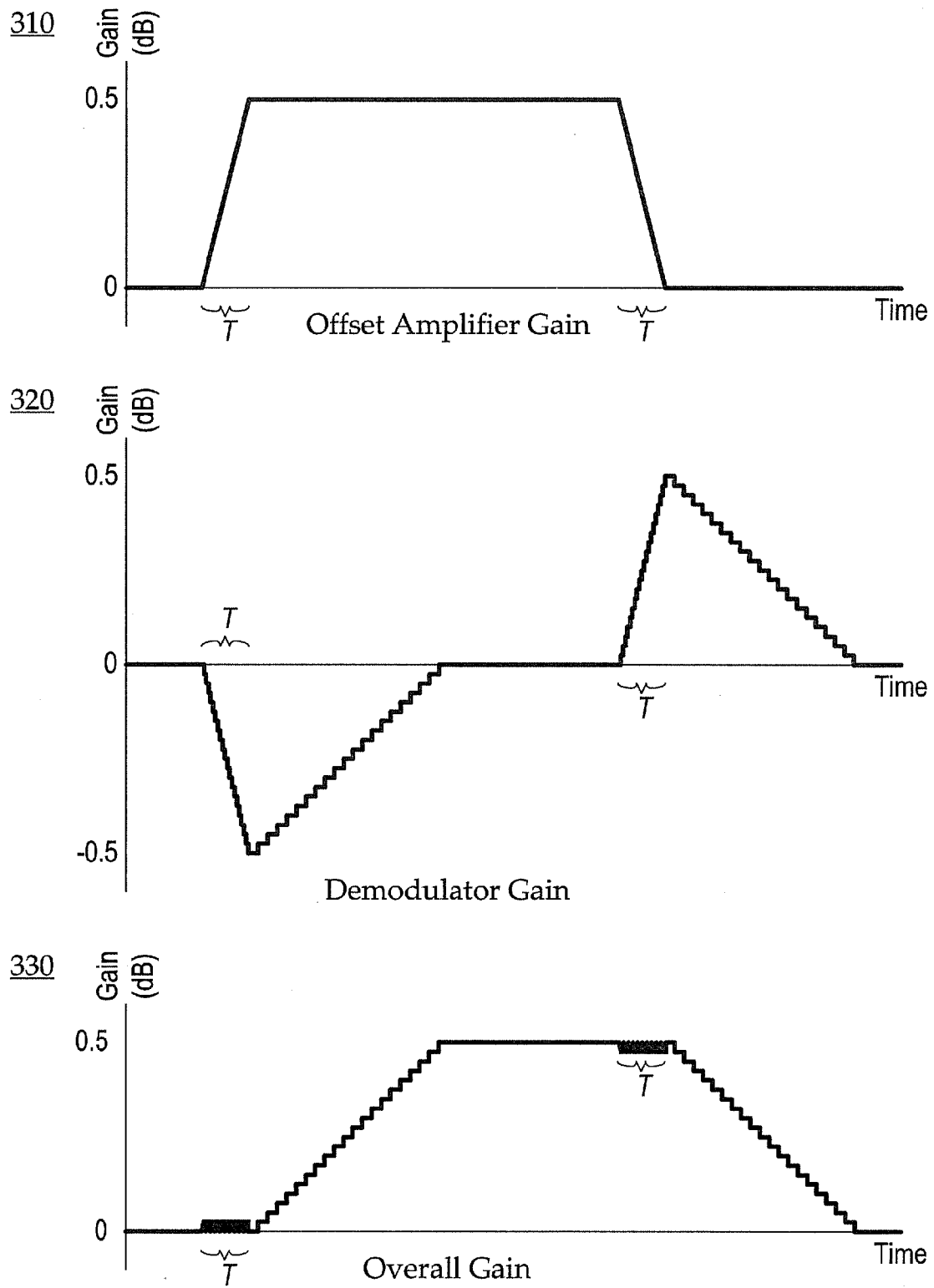
FIG. 3 illustrates graphs of gain levels in another embodiment of the television receiver of FIG. 1.

FIG. 3 illustrates graphs of gain levels in an embodiment of receiver 100, where MCU 190 smoothes the AGC control signals using resistor-capacitor networks, and thus the gain stages are switched on and off gradually. Again, the vertical axes represent gain in dB, and the horizontal axes represent time. Graph 310 illustrates the gain of VGA 156, where, for example, power detector 193 detects a drop and subsequent rise in the output power level of VGA 156. MCU 190 receives the corresponding signal VGA-2 PWR, and asserts the appropriate signal VGA-2 AGC to increase the gain of VGA 156 by 0.5 dB, and subsequently to decrease the gain. of VGA 156 by 0.5 dB. Here, through the addition of the resistor-capacitor network, the gain increases gradually over a period of time T. Graph 320 illustrates the gain of demodulator 180 in response to the drop and subsequent rise in the output power level of VGA 156. Here, when MCU 190 increases the gain of VGA 156 by 0.5 dB in time T, MCU 190 asserts a corresponding signal DEMOD AGC to decrease the gain of demodulator 180 by 0.5 dB in 0.025 dB steps in time T, and to subsequently increase the gain of demodulator 180 by a total of 0.5 dB in 0.025 dB steps over a longer period of time.

Likewise, when MCU 190 decreases the gain of VGA 156 by 0.5 dB, the resistor-capacitor network causes the gain increase to occur over the period of time T. MCU 190 asserts a corresponding signal DEMOD AGC to increase the gain of demodulator 180 by 0.5 dB in 0.025 dB steps in time T, and to subsequently decrease the gain of demodulator 180 by 0.5 dB in 0.025 dB steps over a longer period of time. Graph 330 illustrates the overall gain that results from the combined gain treatment in VGA 156 and demodulator 180. Note that, while VGA 156 has relatively coarse gain steps of 0.5 dB, the overall gain 335 only increases or decreases by at most 0.025 dB steps. Here, again, the output power level of demodulator 180 changes slowly to eliminate flickering in the displayed image, but the output power level of VGA 156 rises and falls smoothly in response to changing conditions. Note that FIG. 3 shows VGA 156 gain changes and demodulator 180 gain changes occurring at substantially the same time. In practice, MCU 190 can delay the assertion of DEMOD AGC with respect to the assertion of VGA-2 AGC to account for signal delay times between VGA 156 and demodulator 180.

In practice, the transient waveform may have other shapes that the linear shapes shown in FIG. 3. For example, the gain levels may increase or decrease in some other way over period T. In such cases, MCU 190 can apply the appropriate signals to compensate by a substantially inverse gain.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:
1. A receiver, comprising:
  a first programmable gain element having an input for receiving a radio frequency (RF) input signal, an output, and a control input, said first programmable gain element having gain steps of a first magnitude;
  a signal processing circuit having an input coupled to said output of said first programmable gain element, and an output;

a second programmable gain element having an input coupled to said output of said signal processing circuit, an output, and a control input, said second programmable gain element having gain steps of a second magnitude that is smaller than said first magnitude;

said signal processing circuit comprising a third programmable gain element having gain steps of a third magnitude; and a controller having a first output coupled to said control input of said first programmable gain element, and a second output coupled to said control input of said second programmable gain element, wherein said controller adjusts again of the receiver by a first desired gain by changing a sum of gains of said first programmable gain element and said third programmable gain element by a first amount and also changing a gain of said second programmable gain element by substantially a corresponding inverse first amount, and subsequently changing said gain of said second programmable gain element incrementally by steps of said second magnitude to achieve said first desired gain.

2. The receiver of claim 1, wherein:
a particular gain step of said first programmable gain element comprises a change of a gain of said first magnitude over a time duration; and
said controller adjusts said gain of the receiver by said first desired gain by changing said gain of said first programmable gain element by said first amount and also changing said gain of said second programmable gain element by said corresponding inverse first amount incrementally by steps of said second magnitude over said time duration, and subsequently changing said gain of said second programmable gain element incrementally by steps of said second magnitude to achieve said first desired gain.

3. The receiver of claim 1, wherein:
said third magnitude is smaller than said first magnitude and larger than said second magnitude.

4. The receiver of claim 1, wherein said controller delays changing said gain of said second programmable gain element to account for signal delay times in said signal processing circuit.

5. The receiver of claim 4, wherein said controller adjusts said gain of the receiver by said first desired gain during a blanking interval associated with a television signal.

6. The receiver of claim 5, wherein said second programmable gain element is part of a television demodulator that outputs said television signal.

7. The receiver of claim 6, wherein said television demodulator is a digital television demodulator.

8. A receiver, comprising:
a first programmable gain element for adjusting a gain of a radio frequency (RE) input signal to provide an adjusted RF input signal, and having gain steps of a first magnitude;
a signal processing circuit for processing said adjusted RF input signal to provide a processed signal;
a second programmable gain element for adjusting a gain of said processed signal to provide an output signal, said second programmable gain element having gain steps of a second magnitude that is smaller than said first magnitude;
said signal processing circuit comprising a third programmable gain element for adjusting a gain of said adjusted RF input signal, and having gain steps of a third magnitude; and a controller for adjusting a gain of the receiver by a desired gain by changing a sum of gains of said first programmable gain element and said third programmable gain element by a first amount and also changing a gain of said second programmable gain element by substantially a corresponding inverse first amount, and subsequently changing said gain of said second programmable gain element incrementally by steps of said second magnitude to achieve said desired gain.

9. The receiver of claim 8, wherein:
a particular gain step of said first programmable gain element comprises a change of a gain of said first magnitude over a time duration; and
said controller adjusts said gain of the receiver by said desired gain by changing said gain of said first programmable gain element by said first amount and also changing said gain of said second programmable gain element by said corresponding inverse first amount incrementally by steps of said second magnitude over said time duration, and subsequently changing said gain of said second programmable gain element incrementally by steps of said second magnitude to achieve said desired gain.

10. The receiver of claim 8, wherein:
said third magnitude is smaller than said first magnitude and larger than said second magnitude.

11. The receiver of claim 8, wherein said controller delays changing said gain of said second programmable gain element by substantially said corresponding inverse first amount to account for signal delay times in said signal processing circuit.

12. The receiver of claim 11, wherein said controller adjusts said gain of the receiver by said desired gain during a blanking interval associated with a television signal.

13. The receiver of claim 12, wherein said second programmable gain element is part of a television demodulator that outputs said television signal.

14. The receiver of claim 13, wherein said television demodulator is a digital television demodulator.

15. A method comprising:
adjusting a gain of a radio frequency (RF) input signal by a first amount to provide an adjusted RF input signal using a gain step of a first magnitude;
processing said adjusted RF input signal to provide a processed signal, said processing said adjusted RF input signal comprises adjusting a gain of said adjusted RF input signal by a second amount;
adjusting a gain of said processed signal by substantially a corresponding inverse of a sum of said first amount and said second amount to provide an output signal; and
subsequently changing a gain of said output signal incrementally using a plurality of gain steps of a second magnitude to achieve a desired gain, said second magnitude being smaller than said first magnitude.

16. The method of claim 15, wherein:
said processing said adjusted RF input signal comprises adjusting said gain of said adjusted RF input signal by said second amount to provide said processed signal using a gain step of a third magnitude, said third magnitude being smaller than said first magnitude and larger than said second magnitude.

17. The method of claim 15, wherein:
said adjusting said gain of said RE input signal comprises changing of a gain by said first magnitude over a time duration; and
said adjusting said gain of said processed signal by said corresponding inverse of a sum of said first amount and said second amount comprises using a plurality of gain steps of said second magnitude over said time duration to provide said output signal.

18. The method of claim 15, wherein said adjusting said gain of said RF input signal occurs during a predetermined period of time.

19. The method of claim 18, wherein said adjusting said gain of said processed signal comprises delaying said adjusting of said processed signal by said corresponding inverse of a sum of said first amount and said second amount to account for signal delay times.

20. The method of claim 19, wherein said adjusting said gain of said processed signal occurs during a blanking interval associated with a television signal.

* * * * *

UNITED STATES PATENT AND TRADEMARK OFFICE
CERTIFICATE OF CORRECTION

PATENT NO. : 8,428,536 B2  
APPLICATION NO. : 12/323040  
DATED : April 23, 2013  
INVENTOR(S) : Ramin Khoini-Poorfard et al.

Page 1 of 1

It is certified that error appears in the above-identified patent and that said Letters Patent is hereby corrected as shown below:

In the Specification:

In column 6, line 65, replace "in" with "In".

In the Claims:

In column 9, line 13, replace "again" with "a gain".

In column 9, line 53, replace "(RE)" with "(RF)".

In column 10, line 63, replace "RE" with "RF".

Signed and Sealed this
Sixteenth Day of July, 2013

Teresa Stanek Rea
*Acting Director of the United States Patent and Trademark Office*